US012648280B2

(12) United States Patent
Qi et al.

(10) Patent No.: US 12,648,280 B2
(45) Date of Patent: Jun. 2, 2026

(54) LIGHT EMITTING MODULE, METHOD OF MANUFACTURING LIGHT EMITTING MODULE, AND DISPLAY DEVICE

(71) Applicant: BOE TECHNOLOGY GROUP CO., LTD., Beijing (CN)

(72) Inventors: Qi Qi, Beijing (CN); Ke Wang, Beijing (CN); Yutao Hao, Beijing (CN); Jianguo Wang, Beijing (CN)

(73) Assignee: BOE Technology Group Co., Ktd., Beijing (CN)

( * ) Notice: Subject to any disclaimer, the term of this patent is extended or adjusted under 35 U.S.C. 154(b) by 570 days.

(21) Appl. No.: 18/041,694

(22) PCT Filed: Mar. 4, 2022

(86) PCT No.: PCT/CN2022/079279
§ 371 (c)(1),
(2) Date: Feb. 14, 2023

(87) PCT Pub. No.: WO2022/262324
PCT Pub. Date: Dec. 22, 2022

(65) Prior Publication Data
US 2023/0369551 A1     Nov. 16, 2023

(30) Foreign Application Priority Data

Jun. 15, 2021     (CN) .......................... 202110663456.6

(51) Int. Cl.
*H01L 33/62*          (2010.01)
*H01L 23/00*          (2006.01)
(Continued)

(52) U.S. Cl.
CPC .......... *H10H 20/857* (2025.01); *H10W 90/00* (2026.01); *H10W 72/242* (2026.01); *H10W 90/724* (2026.01)

(58) Field of Classification Search
CPC .............. H01L 25/043; H01L 25/0657; H01L 25/0756; H01L 25/074; H01L 25/117;
(Continued)

(56) References Cited

U.S. PATENT DOCUMENTS 7,863,614 B2     1/2011   Toyama et al.
9,484,504 B2     11/2016   Bibl et al.
(Continued)

FOREIGN PATENT DOCUMENTS

CN          1431677 A       7/2003
CN       201666504 U      12/2010
(Continued)

OTHER PUBLICATIONS

International Search Report dated Apr. 25, 2022, for corresponding PCT Application No. PCT/CN2022/079279.
(Continued)

*Primary Examiner* — Lawrence C Tynes, Jr.
(74) *Attorney, Agent, or Firm* — Kinney & Lange, P.A.

(57)          ABSTRACT

A light emitting module, a method of manufacturing the light emitting module, and a display device are provided. The light emitting module includes: a back frame; a first substrate; an electronic element array disposed on the first substrate, wherein the electronic element array includes a plurality of electronic elements; an encapsulation layer disposed on the first substrate and covering the electronic element array; and a bonding portion disposed between the back frame and the first substrate, wherein the bonding portion includes a first surface facing the back frame and a second surface facing the first substrate, and the first surface and the second surface are oppositely disposed, wherein a material of the first substrate is an organic material, the back frame is in direct contact with the first surface of the bonding
(Continued)

portion, and the first substrate is in direct contact with the second surface of the bonding portion.

18 Claims, 8 Drawing Sheets

(51) Int. Cl.

| | |
|---|---|
| *H01L 25/075* | (2006.01) |
| *H10H 20/857* | (2025.01) |
| *H10W 90/00* | (2026.01) |
| *H10W 72/20* | (2026.01) |

(58) Field of Classification Search

CPC . H01L 25/0652; H01L 25/071; H01L 25/112; H01L 25/167; H01L 25/0753; H01L 25/16; H01L 2225/06503–06596; H01L 2225/06541–06544; H01L 2225/1058; H01L 2224/16135–16148; H01L 2224/16245–1626; H01L 2224/8085–8089; H01L 2224/8185–8189; H01L 2224/05009; H01L 2224/05025; H01L 2224/05087; H01L 2224/0509; H01L 2224/0557; H01L 2224/08146; H01L 2224/13009; H01L 2224/13025; H01L 2224/16146; H01L 2224/29009; H01L 2224/29025; H01L 2224/0401; H01L 2224/16227; H01L 2224/1703; H01L 2224/73203; H01L 2224/04105; H01L 2224/73253; H01L 2224/12105; H01L 21/76802–76817; H01L 21/76877–76883; H01L 23/5226; H01L 23/3128; H01L 23/49816; H01L 24/16; H01L 24/17; H01L 24/06; H01L 2924/15331; H10H 20/0362; H10H 20/0361; H10H 20/85; H10H 20/36; H10H 20/8512; H10H 20/852; H10H 20/8515; H10W 90/00; H10W 90/724; H10W 72/242; G02F 1/133317; G02F 1/133612; G02F 1/133613; G02F 1/133607; G02F 1/133603

See application file for complete search history.

(56) References Cited

U.S. PATENT DOCUMENTS

| | | | |
|---|---|---|---|
| 10,644,209 B2 | 5/2020 | Hsieh et al. | |
| 10,901,263 B2 | 1/2021 | He et al. | |
| 11,372,282 B2 | 6/2022 | Chiu et al. | |
| 11,506,931 B2 | 11/2022 | Zhang et al. | |
| 11,515,457 B2 | 11/2022 | Hsieh et al. | |
| 2009/0073350 A1 | 3/2009 | Toyama et al. | |
| 2014/0339495 A1 | 11/2014 | Bibl et al. | |
| 2016/0282667 A1 | 9/2016 | Fan | |
| 2016/0329376 A1* | 11/2016 | Kim | H01L 25/0753 |
| 2017/0345983 A1 | 11/2017 | Hsieh et al. | |
| 2018/0182838 A1* | 6/2018 | Yeo | H10K 59/1315 |
| 2019/0157529 A1 | 5/2019 | Hsieh et al. | |
| 2020/0249530 A1 | 8/2020 | He et al. | |
| 2020/0259054 A1 | 8/2020 | Hsieh et al. | |
| 2021/0014982 A1* | 1/2021 | Bok | H10K 77/111 |
| 2021/0200028 A1 | 7/2021 | Zhang et al. | |
| 2021/0389629 A1 | 12/2021 | Chiu et al. | |
| 2022/0320368 A1 | 10/2022 | Hu | |

FOREIGN PATENT DOCUMENTS

| | | | | | |
|---|---|---|---|---|---|
| CN | 103096615 | A | | 5/2013 | |
| CN | 107452852 | A | | 12/2017 | |
| CN | 107861291 | A | | 3/2018 | |
| CN | 209265142 | U | * | 8/2019 | |
| CN | 210514875 | U | | 5/2020 | |
| CN | 111352274 | A | | 6/2020 | |
| CN | 111458941 | A | | 7/2020 | |
| CN | 111596477 | A | | 8/2020 | |
| CN | 111755586 | A | * | 10/2020 | G09F 9/301 |
| CN | 112014995 | A | | 12/2020 | |
| CN | 112198708 | A | | 1/2021 | |
| CN | 112241088 | A | | 1/2021 | |
| CN | 212810335 | U | * | 3/2021 | |
| JP | 2009070756 | A | | 4/2009 | |
| TW | 201507212 | A | | 2/2015 | |
| TW | M611743 | U | | 5/2021 | |

OTHER PUBLICATIONS

Office Action dated Jun. 27, 2022, for corresponding Taiwan Application No. 110137945.

* cited by examiner

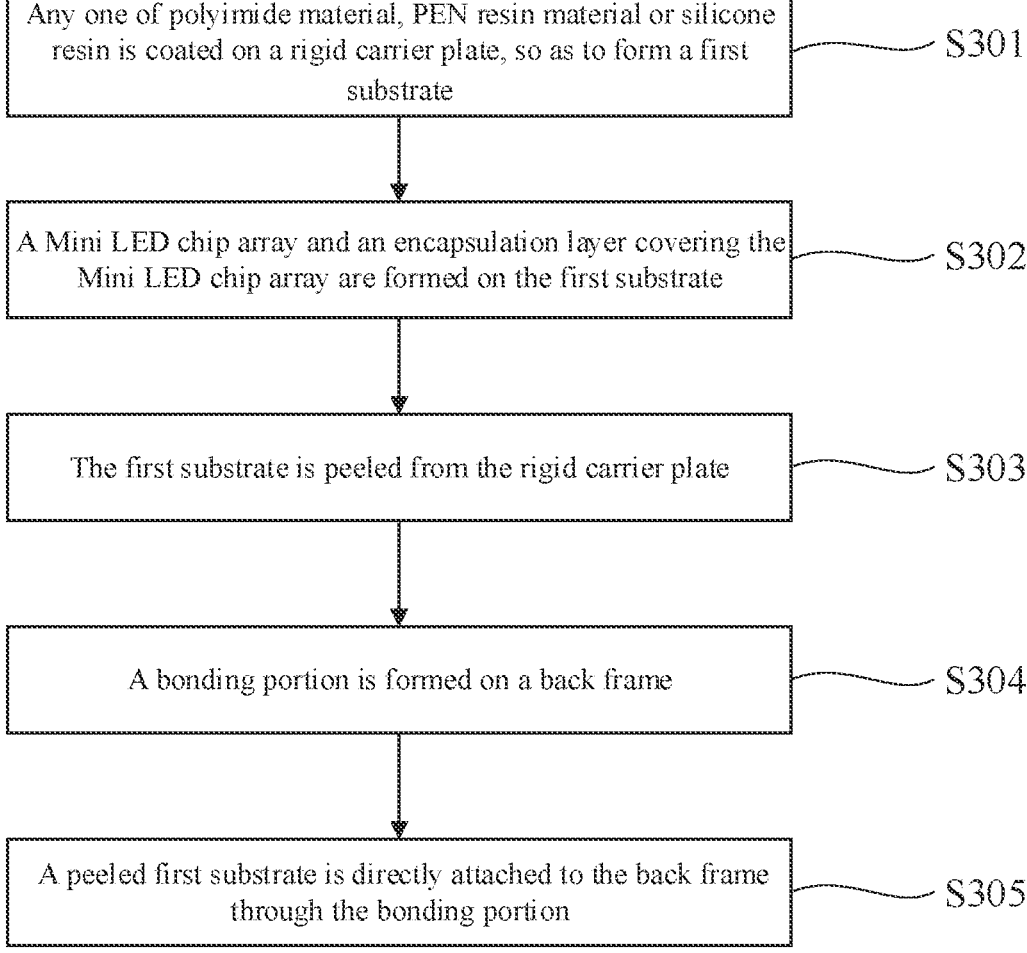

Any one of polyimide material, PEN resin material or silicone resin is coated on a rigid carrier plate, so as to form a first substrate — S301

A Mini LED chip array and an encapsulation layer covering the Mini LED chip array are formed on the first substrate — S302

The first substrate is peeled from the rigid carrier plate — S303

A bonding portion is formed on a back frame — S304

A peeled first substrate is directly attached to the back frame through the bonding portion — S305

FIG. 8

LIGHT EMITTING MODULE, METHOD OF MANUFACTURING LIGHT EMITTING MODULE, AND DISPLAY DEVICE

CROSS REFERENCE TO RELATED APPLICATION(S)

This application is a National Stage Application of International Application No. PCT/CN2022/079279, filed on Mar. 4, 2022, entitled "LIGHT EMITTING MODULE, METHOD OF MANUFACTURING LIGHT EMITTING MODULE, AND DISPLAY DEVICE", which claims priority to Chinese patent Application No. 202110663456.6, filed on Jun. 15, 2021, the entire content of which are incorporated herein in their entireties by reference.

TECHNICAL FIELD

The present disclosure relates to a field of display technology, and in particular to a light emitting module, a method of manufacturing the light emitting module, and a display device.

BACKGROUND

Light Emitting Diode (LED) technology has developed for nearly 30 years, and an application scope of LED has been continuously expanded. For example, LED may be used in a display field, as a backlight source of a display device or as an LED display screen. With the development of technology, Mini Light Emitting Diode (Mini LED) has gradually become a research hotspot in the field of display technology. For example, Mini LED may be used in a light emitting module in a liquid crystal display device as a light emitting element of the light emitting module. In this way, by taking advantage of an advantage of Mini LED, the light emitting module may achieve advantages of thin thickness, zoned dimming, fast response, simple structure, long service life, and the like.

The above information disclosed in this section is only for an understanding of the background of the inventive concept of the present disclosure, and therefore, the above information may contain information that does not constitute the prior art.

SUMMARY

In order to solve at least one aspect of the above-mentioned problems, embodiments of the present disclosure provide a light emitting module, a method of manufacturing the light emitting module, and a display device.

In one aspect, there is provided a light emitting module, including: a back frame; a first substrate; an electronic element array disposed on the first substrate, wherein the electronic element array includes a plurality of electronic elements; an encapsulation layer disposed on the first substrate and covering the electronic element array; and a bonding portion disposed between the back frame and the first substrate, wherein the bonding portion includes a first surface facing the back frame and a second surface facing the first substrate, and the first surface and the second surface are oppositely disposed, wherein a material of the first substrate is an organic material; and wherein the back frame is in direct contact with the first surface of the bonding portion, and the first substrate is in direct contact with the second surface of the bonding portion.

According to some exemplary embodiments, a thickness of the first substrate is between 5 µm to 10 µm According to some exemplary embodiments, a distribution density of the electronic elements is greater than or equal to 1 element/6 mm$^2$.

According to some exemplary embodiments, the light emitting module further includes a display panel, the display panel is located on a light emitting side of the electronic element, the display panel includes a second substrate, and a thickness of the second substrate is about 0.15 mm.

According to some exemplary embodiments, the light emitting module further includes a color conversion layer, and the color conversion layer is located on a light emitting side of the electronic element.

According to some exemplary embodiments, the color conversion layer includes a KSF phosphor.

According to some exemplary embodiments, the light emitting module includes a plurality of film layers located between the first substrate and the electronic element array; wherein the plurality of film layers include: a first conductive layer located on the first substrate; a first planarization layer located on a side of the first conductive layer away from the first substrate; a second conductive layer located on a side of the first planarization layer away from the first substrate; and a second planarization layer located on a side of the second conductive layer away from the first substrate; and wherein the light emitting module further includes a plurality of vent holes, the plurality of vent holes are located between the first planarization layer and the second planarization layer, and the plurality of vent holes respectively expose a part of the first planarization layer.

In another aspect, there is provided a display device, wherein the display device includes the light emitting module described above.

In another aspect, there is provided a method of manufacturing a light emitting module, including:

coating a layer of organic material on a rigid carrier plate, so as to form a first substrate;

forming, on the first substrate, an electronic element array and an encapsulation layer that covers the electronic element array, wherein the electronic element array includes a plurality of electronic elements;

peeling the first substrate from the rigid carrier plate;

forming a bonding portion on a back frame; and directly attaching a peeled first substrate to the back frame through the bonding portion, wherein the bonding portion includes a first surface facing the back frame and a second surface facing the first substrate, the first surface and the second surface are oppositely disposed, the back frame is in direct contact with the first surface of the bonding portion, and the first substrate is in direct contact with the second surface of the bonding portion.

According to some exemplary embodiments, a thickness of the first substrate is between 5 µm to 10 µm.

BRIEF DESCRIPTION OF THE DRAWINGS

Other objectives and advantages of the present disclosure will become apparent by the following description of the present disclosure with reference to the accompanying drawings, which may assist in a comprehensive understanding of the present disclosure.

FIG. 8 shows a flowchart of a method of manufacturing a light emitting module according to some exemplary embodiments of the present disclosure.

Figure 1:
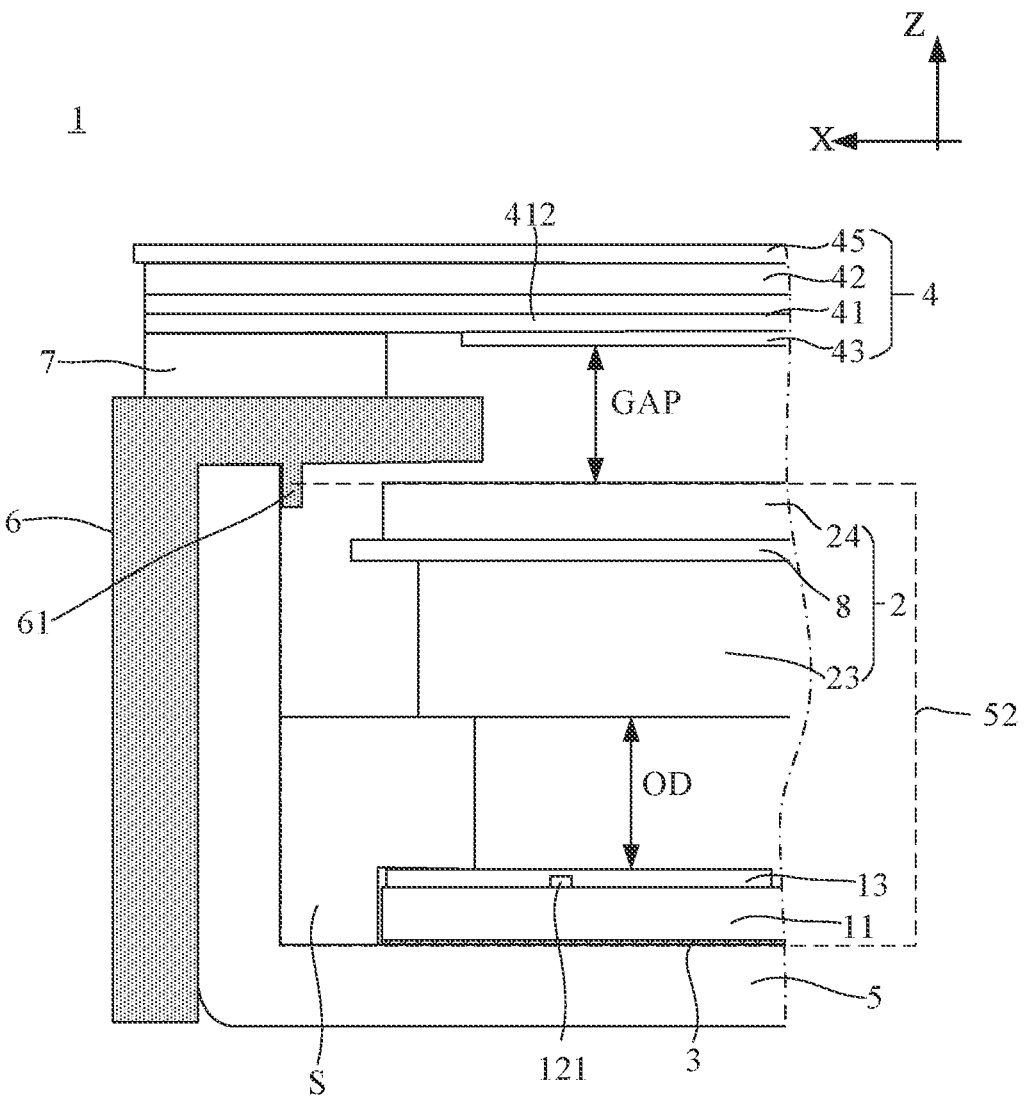
FIG. 1 shows a schematic diagram of a local structure of a display device according to embodiments of the present disclosure.

It should be noted that, for the sake of clarity, sizes of layers, structures or regions in the accompanying drawings used to describe embodiments of the present disclosure may be enlarged or reduced, i.e., the accompanying drawings are not drawn to an actual scale.

DETAILED DESCRIPTION OF EMBODIMENTS

In the following description, for purposes of explanation, numerous specific details are set forth in order to provide a thorough understanding of various exemplary embodiments. It is obvious, however, that various exemplary embodiments may be implemented without these specific details or with one or more equivalent arrangements. In other instances, well-known structures and devices are shown in form of block diagram in order to avoid unnecessarily obscuring various exemplary embodiments. Moreover, various exemplary embodiments may be different, but are not necessarily exclusive. For example, particular shapes, configurations and characteristics of an exemplary embodiment may be used or implemented in another exemplary embodiment without departing from the inventive concept.

In the drawings, sizes and relative sizes of elements may be enlarged for clarity and/or description. As such, sizes and relative sizes of respective elements are not necessarily limited to those shown in the drawings. While exemplary embodiments may be implemented differently, a specific process sequence may be performed differently from the described sequence. For example, two consecutively described processes may be performed substantially simultaneously or in an order reverse to the order described. In addition, same elements are denoted by the same reference signs.

When an element is described as being "on", "connected to" or "coupled to" a further element, the element may be directly on, connected or coupled to the further element or an intervening element may be present. However, when an element is described as being "directly on", "directly connected to" or "directly coupled to" a further element, there is no intervening element. Other terms and/or expressions used to describe a relationship between elements should be interpreted in a similar manner, such as, "between . . . " versus "directly between . . . ", "adjacent" versus "directly adjacent" or "on" versus "directly on", etc. Moreover, a term "connection" may refer to a physical connection, an electrical connection, a communication connection, and/or a fluid connection. Furthermore, X, Y, and Z axes are not limited to three axes of a rectangular coordinate system, and may be interpreted in a broader sense. For example, X, Y, and Z axes may be perpendicular to each other, or may represent different directions that are not perpendicular to each other. For purposes of the present disclosure, "at least one of X, Y and Z" and "at least one selected from a group consisting of X, Y and Z" may be interpreted as X only, Y only, Z only, or any combination of two or more of X, Y and Z, such as XYZ, XYY, YZ and ZZ. As used herein, a term "and/or" includes any and all combinations of one or more of related items listed.

It should be understood that, although the terms first, second, etc. may be used herein to describe different elements, these elements should not be limited by these terms. These terms are only used to distinguish one element from another. For example, without departing from the scope of example embodiments, a first element may be termed as a second element, and similarly, a second element may be termed as a first element.

Herein, an inorganic light emitting diode refers to a light emitting element fabricated by an inorganic material, wherein LED refers to an inorganic light emitting element different from OLED. Specifically, the inorganic light emitting element may include a Mini Light Emitting Diode (Mini LED) and a Micro Light Emitting Diode (Micro LED). The Mini Light Emitting Diode (i.e., Mini LED) refers to a small light emitting diode with a grain size between the Micro LED and the traditional LED. Generally, a grain size of the Mini LED may be between 100 μm and 300 μm.

Herein, an electronic element may include a light emitting element, such as Mini LED, Micro LED, etc. In addition, the electronic element may further include a sensor element or a Micro integrated circuit chip, etc.

Some exemplary embodiments of the present disclosure provide a light emitting module, a method of manufacturing the light emitting module, and a display device including the light emitting module. For example, some embodiments of the present disclosure provide a light emitting module, a method of manufacturing the light emitting module, and a display device. The light emitting module includes: a back frame; a first substrate; a Mini LED chip array disposed on the first substrate, wherein the Mini LED chip array includes a plurality of Mini LED chips; an encapsulation layer disposed on the first substrate and covering the Mini LED chip array; and a bonding portion disposed between the back frame and the first substrate, wherein the bonding portion includes a first surface facing the back frame and a second surface facing the first substrate, and the first surface and the second surface are oppositely disposed, wherein a material of the first substrate is an organic material; and wherein the back frame is in direct contact with the first surface of the bonding portion, and the first substrate is in direct contact with the second surface of the bonding portion. In embodiments of the present disclosure, there is provided the first substrate as a substrate of the Mini LED chip, and the first substrate is directly attached to the back frame, which is conducive to simplifying a structure of the light emitting module and achieving a lightness of the light emitting module.

Herein, for the convenience of description, a component formed by assembling a light emitting module and a display panel is called a display device, that is, the expression "display device" includes a light emitting module, a display panel, and a frame combining the light emitting module and the display panel.

FIG. 1 shows a schematic diagram of a local structure of a display device according to embodiments of the present disclosure. For example, the display device shown in FIG. 1 may be a liquid crystal display device. Referring to FIG. 1, a display device 1 may include a light emitting module 2, a display panel 4 such as a liquid crystal display panel, a back frame 5, and a rubber frame 6.

It should be noted that in the present disclosure, the "back frame" has characteristics of high strength and light weight. A material of the back frame includes a metal material such as aluminum alloy, which may increase a structural strength of the light emitting module, and support and protect the light emitting module; the "rubber frame" refers to a frame connected to the back frame and used to support the display panel and other components, and the rubber frame is fabricated by a soft and elastic material.

Figure 2:
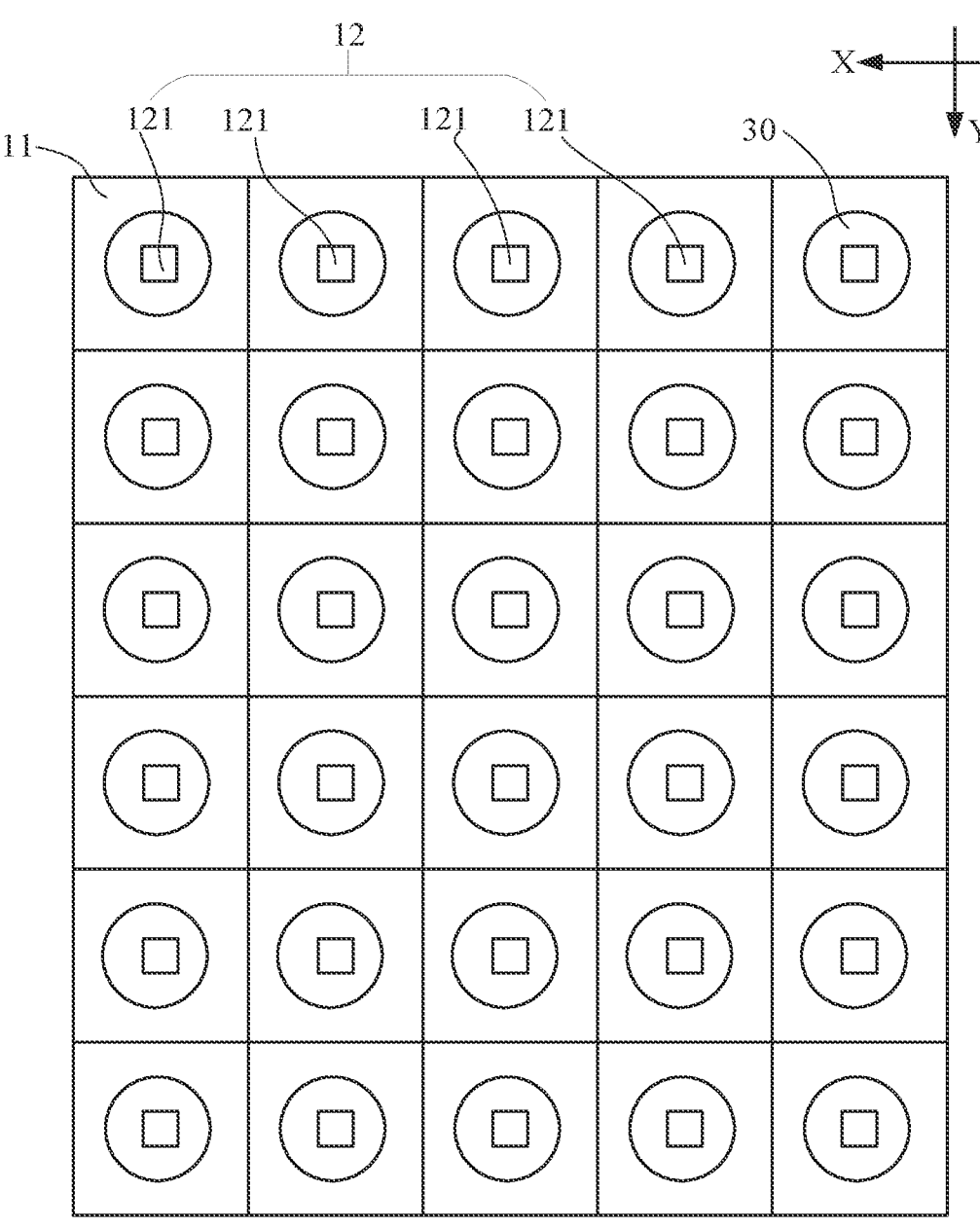
FIG. 2 shows a schematic plan view of a light emitting module according to embodiments of the present disclosure.

In embodiments of the present disclosure, the light emitting module 2 may be a straight-down light emitting module. FIG. 2 shows a schematic plan view of a light emitting module according to embodiments of the present disclosure. Referring to FIG. 1 and FIG. 2, the light emitting module 2 may include a light emitting substrate, for example, the light emitting substrate may include a first substrate 11, a Mini LED chip array 12 disposed on the first substrate 11, and an encapsulation layer 13 covering the Mini LED chip array 12. For example, a material of the first substrate may include any one of polyimide, PEN resin or silicone resin. The encapsulation layer 13 includes a layered structure for encapsulating the Mini LED chip array 12 on the first substrate 11. In some exemplary embodiments, an encapsulation adhesive is coated on a surface of the Mini LED chip in the light emitting substrate, and the encapsulation layer 13 is formed after drying. A material of the encapsulation adhesive may include a transparent light-cured or heat-cured resin, that is, a material of the encapsulation layer 13 may be a transparent protective adhesive. In some embodiments, the encapsulation layer 13 may include a plurality of transparent protective structures 30. The transparent protective structure will be described in more detail in the following in combination with the accompanying drawings.

It should be noted that in FIG. 1 and FIG. 2, a rectangular box is used to represent the Mini LED chip. However, it may be understood that a sectional shape of the Mini LED chip in embodiments of the present disclosure is not limited to rectangular, but may be circular, polygonal and other arbitrary shapes.

The Mini LED chip array 12 may include a plurality of Mini LED chips 121, and the plurality of Mini LED chips 121 are spaced arranged in a first direction X and a second direction Y, i.e., the plurality of Mini LED chips 121 are arranged in an array on the first substrate 11. Each Mini LED chip 121 is electrically connected to the first substrate 11. The first substrate 11 is provided with a pad corresponding to the Mini LED chip. The Mini LED chip is fixedly connected to the corresponding pad, so as to form the Mini LED chip array 12 on the first substrate 11. It should be understood that a density of the Mini LED chip array 12 depends on a light emitting efficiency power of the Mini LED chip, a power consumption requirement of the light emitting substrate and a brightness requirement.

For example, the first direction X and the second direction Y are perpendicular to each other, and a third direction Z is perpendicular to the first direction X and the second direction Y.

In embodiments of the present disclosure, the application of Mini LED chip in the light emitting module is conducive to achieving a more precise local dimming design of the light emitting module, achieving a high dynamic contrast, and achieving a regional dimming, so that the light emitting module has advantages of a better light transmission uniformity, a higher contrast, and more light and dark details.

In some exemplary embodiments of the present disclosure, a material of the first substrate 11 may include polyimide (PI), and a thickness of the first substrate is in a range of 5 μm to 10 μm.

For example, the first substrate 11 may be directly connected to an inner surface of the back frame 5. As shown in FIG. 1, the light emitting module 2 may include a bonding portion 3, for example, the bonding portion 3 may include a double-sided adhesive. The first substrate 11 and the back frame 5 are respectively located on two sides of the bonding portion 3, and are respectively in contact with an upper surface of the bonding portion 3 and a lower surface of the bonding portion 3.

In embodiments of the present disclosure, using the first substrate with a smaller thickness as a substrate of the light emitting substrate is conducive to reducing an overall thickness of the light emitting module. Further, the first substrate is directly connected to the back frame without disposing any back film in the middle, which is conducive to further reducing the overall thickness of the light emitting module. The "back film" refers to a high-viscosity film used to strengthen a mechanical strength, flatness and supporting capacity of a substrate material layer with the Mini LED. For example, the "back film" may include a PET film or a multi-layer film structure including a PSA film and the PET film, and a thickness of the back film is about 100 μm. In embodiments of the present disclosure, there is no need to provide the back film, and the first substrate is in directly contact with the back frame, thus reducing the overall thickness of the light emitting module.

When the material of the first substrate 11 is polyimide, a thermal conductivity of the polyimide is 0.1 W/m·K to 0.35 W/m·K. The back frame 5 contains an iron material with a thermal conductivity of about 150 W/m·K. Since the thickness of the first substrate 11 is small, for example, about 5 μm to 10 μm, and the first substrate 11 is in directly contact with the iron back frame 5, a heat transfer efficiency between the first substrate 11 and the back frame 5 may be greatly improved, which is conducive to an effective dissipation of heat generated in the light emitting module through the back frame 5. Referring to FIG. 1, the light emitting module 2 may further include an optical film group. For example, the optical film group may include optical films such as a diffusion plate 23 and a brightening film 24. It should be understood that the optical film group may further include other types of optical films. The types of optical films included in the optical film group may be selected according to actual use needs.

Referring to FIG. 1, the display panel 4 such as the liquid crystal display panel may include two substrates which are oppositely disposed. For example, the two substrates may be an array substrate 41 and a color film substrate 42 respectively. It should be understood that the display panel 4 may further include a liquid crystal layer disposed between the array substrate 41 and the color film substrate 42. Substrates of the array substrate 41 and the color film substrate 42 may be of glass. In addition, it should be noted that the array substrate and the color film substrate may adopt the structure of the array substrate and the color film substrate commonly used in the art, which will not be repeated here.

The display panel 4 may include, for example, a lower polarizer 43 and an upper polarizer 45. In the embodiment shown in FIG. 1, the lower polarizer 43 is disposed on a lower surface of the array substrate 41, and the upper polarizer 45 is disposed on an upper surface of the color film substrate 42.

For example, in embodiments of the present disclosure, the array substrate 41 may include a second substrate 412, and a thickness of the second substrate 412 may be about 0.15 mm. A material of the second substrate 412 is glass, quartz, and the like.

Referring to FIG. 1, the back frame 5 has an accommodating space 52 for accommodating the light emitting module 2. The rubber frame 6 is used to load the display panel 4. For example, a buffer element 7, such as foam, is disposed between a loading surface of the rubber frame 6 and the lower polarizer 43 of the display panel 4. A part of the rubber frame 6 may be lapped with the back frame 5, and the back frame 5 may have a spacer. A sidewall of the rubber frame 6 and the spacer of the back frame 5 are combined by such means as buckle connection, screw connection, etc. For example, in the embodiment shown in FIG. 1, the rubber frame 6 includes a buckle 61, through which the rubber frame 6 and the back frame 5 may be fixed together.

For example, the light emitting module may further include a color conversion layer 8. For example, the above-mentioned Mini LED chip 121 may be a Mini LED chip that emits blue light. The color conversion layer 8 may convert the blue light emitted by the Mini LED chip 121 into red, green, white and other different colors of light. For example, the color conversion layer 8 may be located above the diffusion plate 23. Alternatively, the color conversion layer 8 may be located below the diffusion plate 23. Embodiments of the present disclosure are not limited to this.

In embodiments of the present disclosure, the color conversion layer 8 may be a quantum dot layer or a KSF phosphor layer. When the color conversion layer 8 is a quantum dot layer, since a particle size of a quantum dot is small, a light conversion efficiency may be guaranteed only when a film thickness of the quantum dot layer reaches a certain range, such as 0.1 mm to 0.2 mm. When the color conversion layer 8 is a phosphor layer, since a particle size of a phosphor is relatively large, a thickness of the phosphor layer may be smaller than the thickness of the quantum dot layer, for example, the thickness of the phosphor layer may be reduced by about 50 μm, for achieving the same light conversion efficiency as the light conversion efficiency of the quantum dot layer. It may be understood that in order to achieve a smaller thickness of the light emitting module, the phosphor layer may be selected as the color conversion layer, while if it is desired to achieve a higher color purity, the quantum dot layer may be selected as the color conversion layer.

Figure 7:
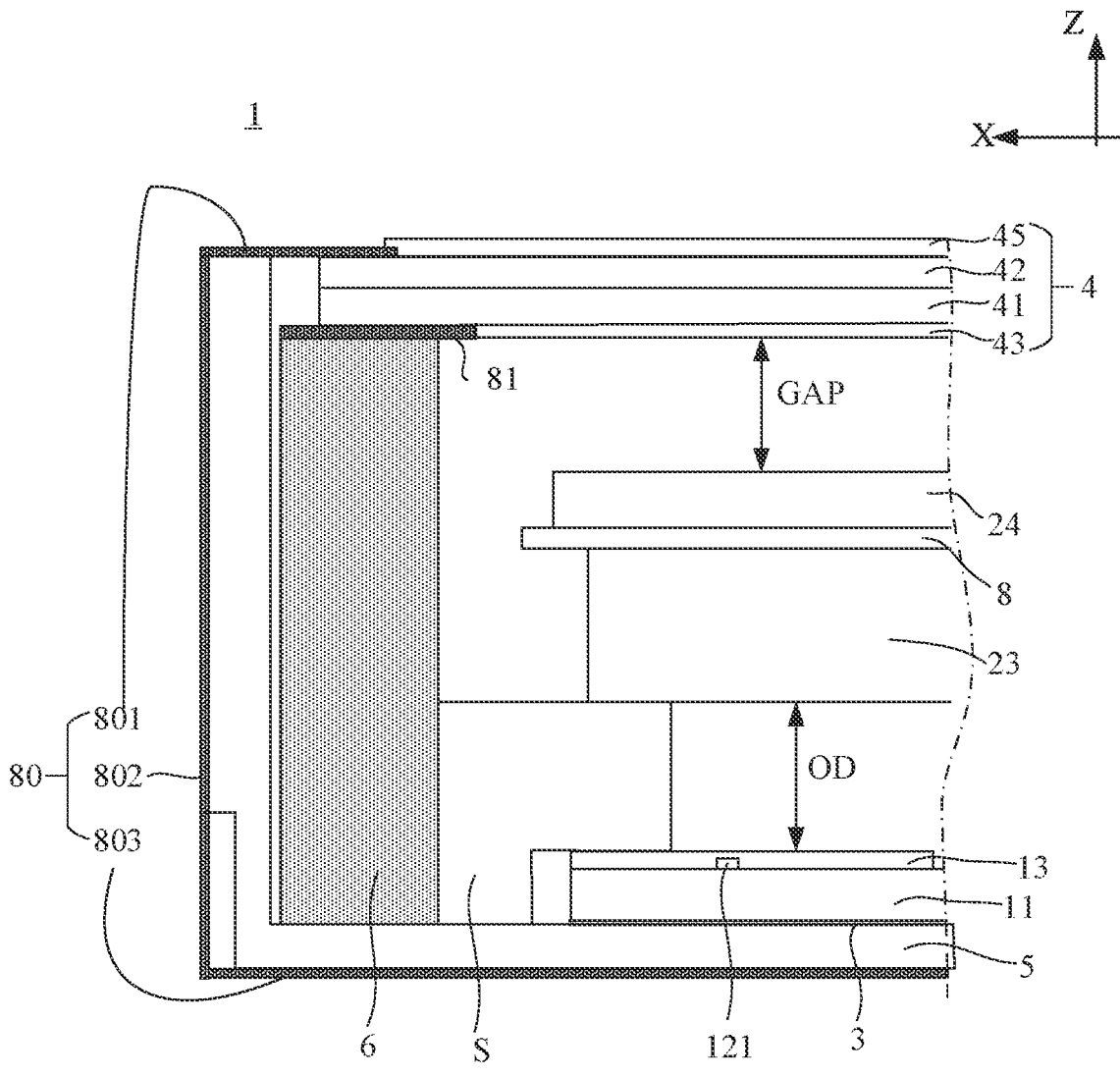
FIG. 7 shows a schematic structural diagram of a light emitting module according to other exemplary embodiments of the present disclosure.

Continue to refer to FIG. 1 and FIG. 7, the optical film group is disposed on a light emitting side of the light emitting substrate. For displays with sizes of about 25 inches and above, in order to fully mix the light emitted from the Mini LED chip array 12 to achieve uniform light output and to facilitate the uniformity of display, an optical distance OD is desired to be set between the light emitting substrate and the optical film group 2. Therefore, the light emitting module further includes a support structure S, so as to ensure the optical distance OD between the light emitting substrate and the optical film group 2. For displays with sizes of 25 inches and below, the optical distance OD may not be set, that is, the light emitting substrate is disposed in direct contact with the optical film group 2, thus the light emitting module may also not contain the support structure S.

It should be noted that in FIG. 1, the diffusion plate 23 and the brightening film 24 are schematically shown. However, the optical film group in embodiments of the present disclosure may further include other types of optical films. In addition, each of the diffusion plate 23 and the brightening film 24 may include a one-layer film or a multi-layer film.

There is a certain distance GAP between the optical film group and the display panel 4, that is, there is no direct contact between the optical film group and the display panel 4. For example, having a cavity structure may cause the light emitted from the optical film group to inject uniformly into the display panel 4, which is conducive to achieving the uniformity of the display.

In embodiments of the present disclosure, a distribution density of the Mini LED chip 12 may be increased to reduce the OD and the GAP described above, so as to further reduce the overall thickness of the light emitting module. The distribution density of the Mini LED chips 121 may be greater than or equal to 6 chips/36 mm², i.e., greater than or equal to 1 chip/6 mm². For example, in some examples, the distribution density of the Mini LED chips 121 may be 6-8 chips/36 mm². By setting the distribution density of the Mini LED chips, the overall thickness of the light emitting module may be reduced by 0.4 mm. For example, for displays with sizes of 25 inches and below, in a case of increasing the distribution density of the Mini LED chip array 12, the OD may not be set, that is, the light emitting substrate is disposed to be in direct contact with the optical film group 2, thus the light emitting module may also not include the support structure S. In the above case, the overall thickness of the light emitting module may be less than 2 mm, thereby achieving an ultra-thin light emitting module. It should be noted that the "overall thickness of the light emitting module" here may be a sum of an overall thickness of the light emitting substrate and an overall thickness of the optical film group 2.

It may be understood that since the first substrate of the light emitting module may include different types of electronic elements, the distribution density of the electronic elements mentioned in embodiments of the present disclosure refers to a distribution density of the same type of electronic elements with the largest number in the light emitting module. For example, there are three types of electronic elements on the first substrate of the light emitting module: Mini LED chip, Micro integrated circuit chip and temperature sensitive sensor, wherein the number of Mini LED chips is the largest, thus the distribution density of Mini LED chips 12 on the first substrate may be greater than or equal to 1 chip/6 mm².

For example, in a case of increasing the distribution density of the Mini LED chip 121, the thickness of the optical film in the optical film group, such as the thickness of the diffusion plate 23, may be reduced, so that the overall thickness of the light emitting module may be further reduced, and an overall weight of the light emitting module may be reduced accordingly.

In some embodiments, a light emitting surface of the Mini LED chip 121 may have four sides of equal length (that is, the light emitting surface of the Mini LED chip 121 is square), or the light emitting surface of the Mini LED chip 121 may have sides of different lengths (for example, non-square rectangular shape). In the present disclosure, the light emitting surface of the Mini LED chip 121 being a square is taken as an example to illustrate, as shown in FIG. 2.

In some embodiments, one light emitting unit only includes one Mini LED chip 121. In other embodiments, one light emitting unit may further include a plurality of Mini LED chips 121, such as two or more Mini LED chips 121, which are not specifically limited here. In some embodiments, the plurality of Mini LED chips 121 contained in one light emitting unit may be connected in series, parallel, or series-parallel connection, which are not specifically limited here.

Figure 3:
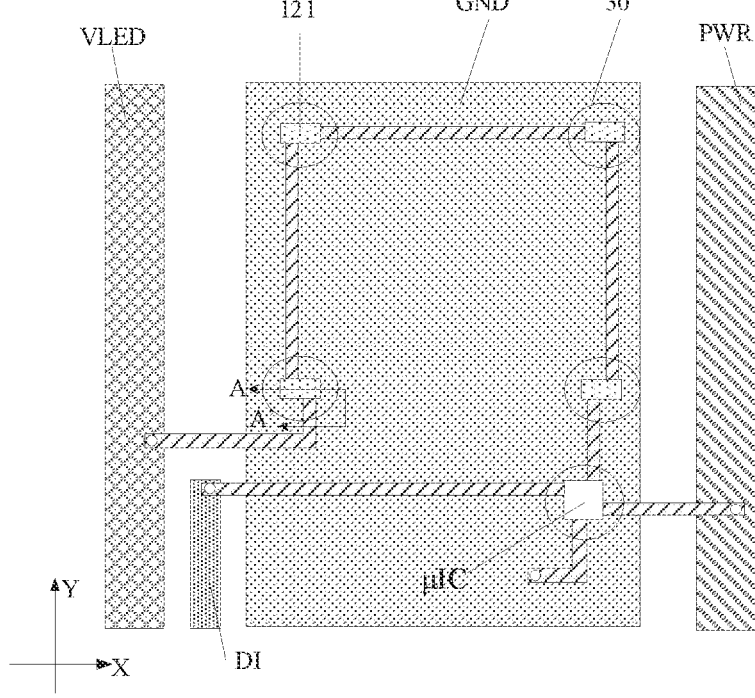
FIG. 3 shows a plan view of a light emitting unit according to some exemplary embodiments of the present disclosure.

FIG. 3 shows a plan view of a light emitting unit according to some exemplary embodiments of the present disclosure, which schematically shows that one light emitting unit includes four Mini LED chips 121 arranged in series. For example, a micro integrated circuit μIC may provide a signal to four Mini LED chips 121 in one light emitting unit. In some embodiments, one micro integrated circuit μIC may also provide a signal to a plurality of light emitting units. On a light emitting substrate including the micro integrated circuit μIC, a side of the Mini LED chip 121 away from the light emitting substrate is provided with a transparent protective structure 30, and the transparent protective structure 30 may protect a wrapped micro integrated circuit μIC. In addition, in order to facilitate a fabrication, the transparent protective structure 30 above the micro integrated circuit μIC and the transparent protective structure 30 above the Mini LED chip 121 have the same fabrication requirements, and the two are formed in the same process.

It may be understood that in embodiments of the present disclosure, the light emitting substrate of the light emitting module includes a light emitting region and a peripheral region. All Mini LED chips 121 and the micro integrated circuit μIC are all disposed in the light emitting region, and the Mini LED chips 121 and the micro integrated circuit μIC are electrically connected to the corresponding pad on the light emitting substrate through a series of processes such as picking, transferring and fixing. The peripheral region is used to connect to an external drive circuit, such as a flexible printed circuit (FPC) or a printed circuit board (PCB). For example, the peripheral region may be provided with a binding pad 107 to electrically connect to a gold finger structure on the circuit board.

Figure 4:
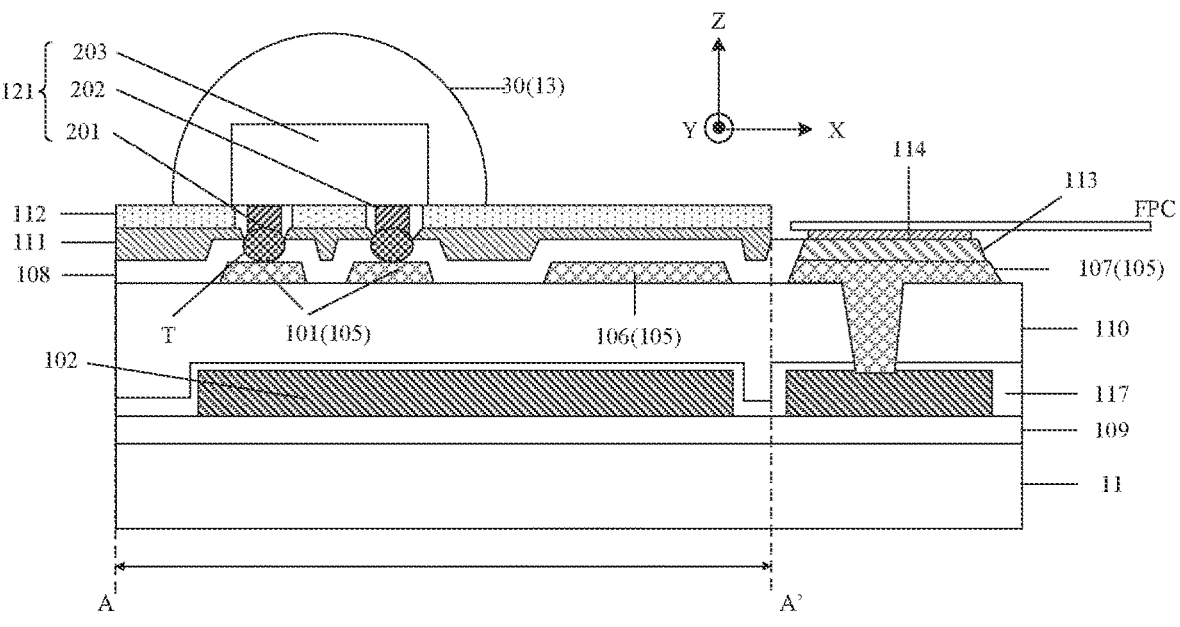
FIG. 4 shows a schematic diagram of a sectional structure of a light emitting module intercepted along line AA' in FIG. 3 according to embodiments of the present disclosure.

FIG. 4 shows a schematic diagram of a sectional structure of a light emitting module intercepted along line AA' in FIG. 3 according to embodiments of the present disclosure. Referring to FIG. 2 to FIG. 4, the Mini LED chip 121 includes a light emitting portion 203 and two pins 201 and 202 (N pad and P pad respectively), the two pins are connected to the pads 101 through solder pastes T respectively, and each pad 101 is connected according to positions of the Mini LED chips 121 in the electrical circuit. Specifically, in FIG. 3, a P pad of the Mini LED chip 121 at a lower left corner is connected to a drive voltage line VLED; a N pad of the Mini LED chip 121 at the lower left corner is connected to a P pad of the Mini LED chip 121 at an upper left corner; a N pad of the Mini LED chip 121 at the upper left corner is connected to a P pad of the Mini LED chip 121 at an upper right corner; a N pad of the Mini LED chip 121 at the upper right corner is connected to a P pad of the Mini LED chip 121 at a lower right corner; and a N pad of the Mini LED chip 121 at the lower right corner is connected to an output end of the micro integrated circuit μIC. In some embodiments, the micro integrated circuit μIC may have a plurality of pins, such as 4 pins, which are respectively connected to the pads on the light emitting substrate through the solder paste, and each pad is respectively connected to a source power line PWR, a common voltage line GND, an address line DI, and the Mini LED chip 121 in the corresponding light emitting unit.

In some embodiments, referring to FIG. 2 to FIG. 4, the light emitting module may further include a first conductive layer 102, and the first conductive layer 102 is generally used for arranging various signal lines, such as the common voltage line GND, the drive voltage line VLED, the source power line PWR, the address line DI, etc. Optionally, a thickness of the first conductive layer 102 is about 1.5 μm to 7 μm, and a material of the first conductive layer may include copper. For example, a stack material such as MoNb/Cu/MoNb may be formed by sputtering. A material in the stack on a side close to the substrate 11 is MoNb, with a thickness of about 300 Å, which is mainly used to improve an adhesion between a film layer and the substrate 11. A material of an interlayer of the stack is Cu, which is a preferred material for an electric signal transmission channel. A material on a side away from the first substrate 11 is MoNb, with a thickness of about 200 Å, which may be used to protect the interlayer and prevent oxidation of a surface of the interlayer with low resistivity due to exposure. Since a thickness of single sputtering is generally not greater than 1 when the first conductive layer 102 with a thickness exceeding 1 μm is manufactured, a plurality of times of sputtering are required to form the first conductive layer 102. In addition, the first conductive layer 102 may also be formed by electroplating. Specifically, a seed layer may be formed by using MoNiTi first to improve a nucleation density of metal grains in a subsequent electroplating process, then the copper with low resistivity may be fabricated by electroplating, and then an anti-oxidation layer may be fabricated, and a material of the anti-oxidation layer may be MoNiTi. Optionally, a surface of the first conductive layer 102 away from the first substrate 11 may be covered by a first insulating layer 104, so as to ensure the reliability and stability of an electrical path.

In some embodiments, referring to FIG. 2 to FIG. 4, the light emitting module may further include: a second conductive layer 105, and the second conductive layer 105 is generally used for disposing a pad and a connection lead 106. Optionally, a film layer thickness of the second conductive layer 105 is about 6000 Å. The pads are used to bind various electronic elements, and may include, for example, the pad 101 located in the light emitting region for installing the Mini LED chip 121, and/or a pad for installing a functional element such as a Micro integrated circuit chip or a sensor, and the binding pad 107 located in the peripheral region for connecting to the circuit board. A surface of the pad on a side away from the first substrate 11 is desired to be partially exposed before the pad is connected to the electronic element. In order to prevent an oxidation problem that may occur when the pad is exposed to the air during a process from the substrate fabrication to a process of disposing the electronic element on the substrate, an anti-oxidation material layer may be provided only in an exposed surface region of the pad, that is, a surface of the pad region may have one more layer than the region where the connection lead 106 is located; or the second conductive layer 105 is entirely provided as a stack structure of at least two layers, and a film material of the second conductive layer 105 away from the first substrate 11 is an anti-oxidation metal or alloy material. Specifically, the second conductive layer 105 may be composed of a stack structure such as MoNb/Cu/CuNi. A bottom layer material MoNb in the stack is mainly used to improve adhesion. An interlayer Cu in the stack is mainly used to transmit an electrical signal due to low resistivity. A top layer CuNi in the stack may prevent an oxidation of the interlayer, and may also ensure a firmness of connection to the electronic element. The connection lead 106 may include a first lead extending in the first direction X and a second lead extending in the second direction Y, and a surface of the first lead and a surface of the second lead on a side away from the first substrate 11 may be covered by a second insulating layer 108, so as to ensure the reliability and stability of the electrical path.

In some embodiments, as shown in FIG. 4, the light emitting module may further include a buffer layer 109 located between the first substrate 11 and the first conductive layer 102, a first planarization layer 110 located between a first insulating layer 117 and the second conductive layer 105, a second planarization layer 111 and a reflective layer 112 located on a side of the second insulating layer away from the second conductive layer 105 sequentially, a transparent electrode 113 located on the binding pad 107 in the peripheral region, and an anisotropic conductive adhesive 114 located between the transparent electrode 113 and the flexible printed circuit FPC. The buffer layer 109 may prevent impurities in the first substrate 11 from affecting a conductive property of the first conductive layer 102. The first planarization layer 110 may provide a planarized surface for the fabrication of the second conductive layer 104. The second planarization layer 110 may provide a planarized surface for a subsequent binding of the Mini LED chip 121. A material of the reflective layer 112 may be white ink, which is used to improve a reflectivity of the light emitting substrate 01 to reduce light loss. The transparent electrode 113 and the anisotropic conductive adhesive 114 are used to achieve the electrical connection between the binding pad 107 in the peripheral region and the flexible printed circuit FPC.

Figure 5:
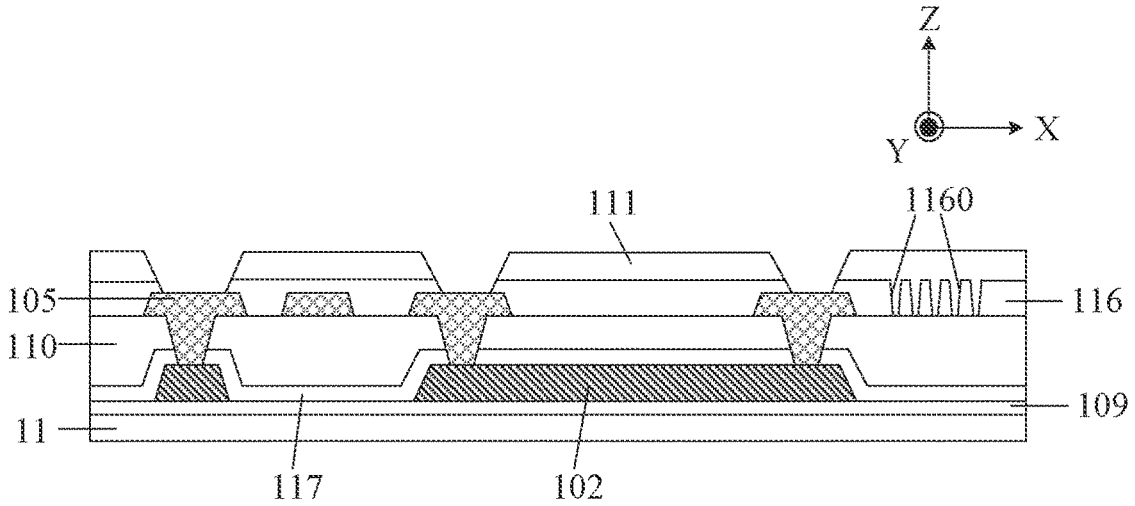
FIG. 5 shows a schematic diagram of a sectional structure of a light emitting module intercepted along line AA' in FIG. 3 according to other embodiments of the present disclosure.

FIG. 5 shows a schematic diagram of a sectional structure of a light emitting module intercepted along line AA' in FIG. 3 according to other embodiments of the present disclosure. In order to clearly show the film layer structure on the light emitting substrate, the Mini LED chip is not shown in FIG. 5. As shown in FIG. 5, the light emitting substrate of the light emitting module may include: a first substrate 11; a buffer layer 109 located on the first substrate 11; a first conductive layer 102 located on a side of the buffer layer 109 away from the first substrate 11; a first insulating layer 117 located on a side of the first conductive layer 102 away from the first substrate 11; a first planarization layer 110 located on a side of the first insulating layer 117 away from the first substrate 11; a second conductive layer 105 located on a side of the first planarization layer 110 away from the first substrate 11; a second insulating layer 116 located on a side of the second conductive layer 105 away from the first substrate 11; and a second planarization layer 111 located on a side of the second insulating layer 116 away from the first substrate 11.

As shown in FIG. 5, the second insulating layer 116 is located between the first planarization layer 110 and the second planarization layer 111. In a case that a material of the second planarization layer 111 is an organic insulating material, a plurality of vent holes 1160 may be disposed in the second insulating layer 116. The plurality of vent holes 1160 respectively expose a part of the underlying first planarization layer 110. In a process of manufacturing the light emitting substrate, a gas gathered in the first planarization layer 110 may be released through the vent hole 1160, so as to avoid problems of warping and peeling of the film layer of the light emitting substrate, thereby improving a product yield.

For example, in the embodiment shown in FIG. 5, a plurality of vent holes 1160 are provided, however, this is only schematic, not a limitation on embodiments of the present disclosure. In other embodiments, more or less vent holes may be provided.

Figure 6A:
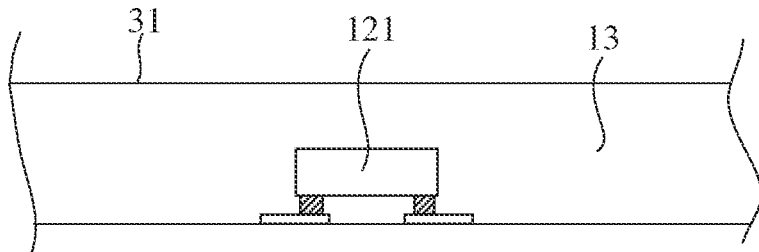
FIG. 6A to FIG. 6C respectively show schematic structural diagrams of a transparent protective structure of a light emitting module according to some exemplary embodiments of the present disclosure.
Figure 6B:
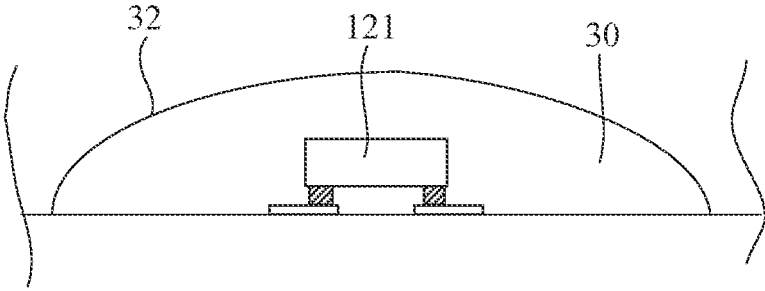
Figure 6C:
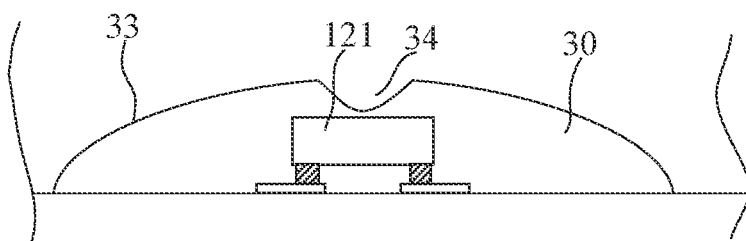

FIG. 6A to FIG. 6C respectively show schematic structural diagrams of an encapsulation layer 13 of a light emitting module according to some exemplary embodiments of the present disclosure. Referring to FIG. 6A, the encapsulation layer 13 of the Mini LED chip may have a planarized upper surface 31, and the encapsulation layer may cover all Mini LED chips 121. For example, a refractive index of the encapsulation layer 13 may be between 1.2 and 1.5, between 1.3 and 1.4, less than 1.4, less than 1.5, greater than 1.1, greater than 1.2, greater than 1.3, about 1.35, etc. Referring to FIG. 6B, the encapsulation layer 13 of the Mini LED chip includes a plurality of transparent protective structures 30, and each of the plurality of transparent protective structures 30 may have a curved upper surface 32 (such as a convex upper surface). The transparent protective structure 30 may form a dome shape above the Mini LED chip. In the embodiment, the transparent protective structure may be called a droplet lens. For example, a refractive index of the transparent protective structure 30 may be between 1.2 and 1.5, between 1.3 and 1.4, less than 1.4, less than 1.5, greater than 1.1, greater than 1.2, greater than 1.3, about 1.35, etc. Each Mini LED chip may have a corresponding transparent protective structure portion. For example, in order to reduce a probability of total reflection of an emitted light of the Mini LED chip 121 on an interface between the transparent protective structure 30 and the air, the refractive index of the transparent protective structure 30 may be between a refractive index of the Mini LED chip 121 and a refractive index of the air.

Referring to FIG. 6C, the transparent protective structure 30 may have a curved upper surface 33 and a groove 34. The transparent protective structure 30 forms the groove 34 on the Mini LED chip. The groove 34 may have any desired shape (for example, a pyramid shape). Compared with the embodiment of FIG. 6A, the groove 34 may further increase the uniformity of the emitted light.

FIG. 7 shows a schematic structural diagram of a light emitting module according to other exemplary embodiments of the present disclosure. Next, structural differences between FIG. 7 and FIG. 1 will be mainly described. Portions of FIG. 7 that are not described below may refer to the description of the structure of FIG. 1, which will not be repeated here. Referring to FIG. 7, the light emitting module may further include an adhesive tape 80 and an adhesive tape 81 for attaching the light emitting module and the display panel together. The adhesive tape 81 is located in a region where the rubber frame 6 is in contact with the display panel 4. Since the rubber frame is a frame structure, a projection of the adhesive tape 81 on a plane where the display panel 4 is located is square, i.e., the adhesive tape 81 is disposed around the peripheral region of the display panel. The adhesive tape 80 is attached to an edge of an upper surface of the display device, a side surface of the display device and an edge of a lower surface of the display device. Specifically, the adhesive tape 80 may include a first portion 801, a second portion 802 and a third portion 803. The first portion 801 of the adhesive tape 80 is attached to an edge of a surface on a side of the back frame 5 away from the display panel, the second portion 802 of the adhesive tape 80 is attached to a sidewall of the back frame 5, and the third portion 803 of the adhesive tape 80 is attached to an edge of a surface on a side of the back frame 5 away from the light emitting module. The adhesive tape 80 is a continuously extending tape, that is, the first portion 801 of the adhesive tape 80, the second portion 802 of the adhesive tape 80 and the third portion 803 of the adhesive tape 80 are connected as a whole. Through the above settings, the adhesive tape 80 may fix the display panel, so as to attach the light emitting module and the display panel together.

Optionally, the adhesive tape 80 may be composed of a light-shielding material, for example, the tape 80 may be a black adhesive tape. The adhesive tape 80 is attached to the edge of the lower surface of the display device, the sidewall of the display device and the edge of the upper surface of the display device, which may block the light of an entire non-display region of the display device, thereby reducing or even avoiding a light leakage rate of the display device. Optionally, the adhesive tape 80 may be composed of a conductive material, so that the adhesive tape 80 may play a role of electrostatic discharge or electrostatic shielding.

FIG. 8 shows a flowchart of a method of manufacturing a light emitting module according to some exemplary embodiments of the present disclosure. Referring to FIG. 8, the method of manufacturing a light emitting module may include the following steps.

In step S301, any one of polyimide material, PEN resin material or silicone resin is coated on a rigid carrier plate, so as to form a first substrate. A material of the rigid carrier plate may be glass, quartz, etc.

In step S302, a Mini LED chip array and an encapsulation layer covering the Mini LED chip array are formed on the first substrate, and the Mini LED chip array includes a plurality of Mini LED chips.

In step S303, the first substrate is peeled from the rigid carrier plate.

In step S304, a bonding portion is formed on a back frame.

In step S305, a peeled first substrate is directly attached to the back frame through the bonding portion, wherein the bonding portion includes a first surface facing the back frame and a second surface facing the first substrate, the first surface and the second surface are oppositely disposed, the back frame is in direct contact with the first surface of the bonding portion, and the first substrate is in direct contact with the second surface of the bonding portion.

Exemplarily, according to some embodiments of the present disclosure, the method of manufacturing a light emitting module may be specifically performed according to the following steps.

In step S401, any one of polyimide material, PEN resin material or silicone resin is coated on a rigid carrier plate and cured, so as to form a first substrate.

In step S402, a buffer layer such as silicon nitride is deposited on the first substrate. For example, a thickness of the silicon nitride is 1000 Å to 10000 Å. On the one hand, the buffer layer may be used as a stress buffer layer to adjust a stress in the first substrate, which is conducive to a subsequent formation of a conductive layer pattern. On the other hand, in step S401, the first substrate is generally formed by a wet process. In the wet process, an oxygen-containing component is introduced. By forming the buffer layer on the first substrate, the oxygen-containing component may be isolated from the conductive layer pattern, so as to prevent the oxygen-containing component from corroding the subsequently formed conductive layer pattern, thereby protecting the subsequently formed conductive layer pattern.

In step S403, a thick copper layer is formed on the buffer layer, and a thick copper pattern is fabricated through a patterning process. For example, a thickness of the thick copper layer is greater than 2 µm.

In step S404, an insulating layer, such as silicon nitride, is deposited on the thick copper layer, and is patterned by a patterning process to fabricate a first via hole that exposes at least a part of the thick copper layer.

In step S405, a pad layer is deposited on the insulating layer, and the pad layer is electrically connected to the thick copper layer through the via hole.

In step S406, a protective layer is deposited and patterned through a patterning process to fabricate a second via hole, and the second via hole exposes at least a part of the pad layer. For example, the protective layer includes silicon nitride, silicon oxide or any combination thereof.

In step S407, a white oil layer is formed through a printing process, so as to expose the second via hole. It should be noted that white oil has good light reflectivity, and may improve the light-emitting brightness and efficiency of the Mini LED chip.

In step S408, a plurality of Mini LED chips are fixedly connected to their corresponding pads.

In step S409, a transparent silica gel material is coated on the plurality of Mini LED chips and cured, so as to form an encapsulation layer.

In step S410, a low viscosity protective film is attached to the silica gel. The low viscosity protective film may be a TPF film to protect the light emitting substrate from collision and abrasion. After the low viscosity protective film is attached, the low viscosity protective film is connected to the silica gel layer through van der Waals force.

In step S411, the first substrate is separated from the rigid carrier plate by a laser lift-off process, for example. In the process, the low viscosity protective film may prevent the first substrate from bending or curling after being peeled from the rigid carrier plate.

In step S412, a high viscosity double-sided adhesive is coated on the back frame, and then the separated first substrate is directly attached on the back frame.

In step S413, the low viscosity protective film is peeled.

It should be noted that some steps of the above-mentioned method may be executed separately or in combination, and may be executed in parallel or in sequence, which is not limited to a specific operation sequence shown in the figure.

Figure 9:
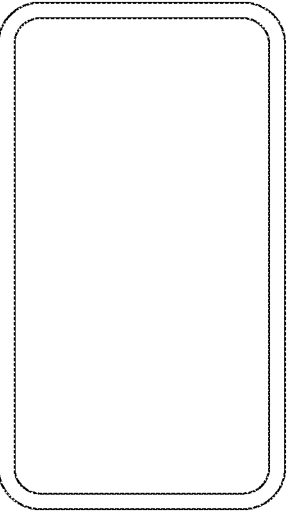
FIG. 9 shows a schematic diagram of a display device according to some exemplary embodiments of the present disclosure.

Some exemplary embodiments of the present disclosure further provide a display device. FIG. 9 shows a schematic diagram of a display device according to some exemplary embodiments of the present disclosure. Referring to FIG. 9, the display device includes the above-described light emitting module.

The display device may be any product or component with a display function. For example, the display device may be a smart phone, a portable phone, a navigation device, a television (TV), a car audio body, a laptop computer, a tablet computer, a portable multimedia player (PMP), a personal digital assistant (PDA), etc.

It should be understood that the display device according to some exemplary embodiments of the present disclosure has all the features and advantages of the above-mentioned light emitting module, which may be referred to the above description of the light emitting substrate, and will not be repeated here.

As used herein, the terms "substantially", "about", "approximately", and other similar terms are used as terms of approximation rather than as terms of degree, and are intended to account for inherent deviations in measured or calculated values that would be recognized by those of ordinary skill in the art. As used herein, "about" or "approximately" includes the stated values, and indicates that the particular values determined by those of ordinary skill in the art are within acceptable tolerances, taking into account factors such as process fluctuations, measurement problems, and errors associated with measurement of the particular quantities (i.e., limitations of a measurement system). For example, "about" may mean within one or more standard deviations, or within ±10% or ±5% of the stated values.

Some embodiments of the general inventive concept of the present disclosure have been illustrated and described. However, those of ordinary skill in the art will appreciate that these embodiments may be changed without departing from the principles and spirit of the general inventive concept of the present disclosure. The scope of the present disclosure is defined by the claims and their equivalents.

What is claimed is:

1. A light emitting module, comprising:
a back frame;
a first substrate;
an electronic element array disposed on the first substrate, wherein the electronic element array comprises a plurality of electronic elements;
an encapsulation layer disposed on the first substrate and covering the electronic element array; and
a bonding portion disposed between the back frame and the first substrate, wherein the bonding portion comprises a first surface facing the back frame and a second surface facing the first substrate, and the first surface and the second surface are oppositely disposed,
wherein a material of the first substrate is an organic material;
wherein the back frame is in direct contact with the first surface of the bonding portion, and the first substrate is in direct contact with the second surface of the bonding portion;
wherein the light emitting module comprises a plurality of film layers located between the first substrate and the electronic element array;
wherein the plurality of film layers comprise: a first conductive layer located on the first substrate; a first planarization layer located on a side of the first conductive layer away from the first substrate; a second conductive layer located on a side of the first planarization layer away from the first substrate; and a second planarization layer located on a side of the second conductive layer away from the first substrate; and
wherein the light emitting module further comprises a plurality of vent holes, the plurality of vent holes are located between the first planarization layer and the second planarization layer, and the plurality of vent holes respectively expose a part of the first planarization layer.

2. The light emitting module according to claim 1, wherein a thickness of the first substrate is between 5 μm to 10 μm.

3. The light emitting module according to claim 1, wherein a distribution density of the electronic elements is greater than or equal to 1 element/6 mm$^2$.

4. The light emitting module according to claim 1, wherein the light emitting module further comprises a display panel, the display panel is located on a light emitting side of the electronic element, the display panel comprises a second substrate, and a thickness of the second substrate is about 0.15 mm.

5. The light emitting module according to claim 1, wherein the light emitting module further comprises a color conversion layer, and the color conversion layer is located on a light emitting side of the electronic element.

6. The light emitting module according to claim 1, wherein the color conversion layer comprises a KSF phosphor.

7. A display device, wherein the display device comprises the light emitting module according to claim 1.

8. The light emitting module according to claim 2, wherein a distribution density of the electronic elements is greater than or equal to 1 element/6 mm2.

9. The light emitting module according to claim 2, wherein the light emitting module further comprises a display panel, the display panel is located on a light emitting side of the electronic element, the display panel comprises a second substrate, and a thickness of the second substrate is about 0.15 mm.

10. The light emitting module according to claim 2, wherein the light emitting module further comprises a color conversion layer, and the color conversion layer is located on a light emitting side of the electronic element.

11. The light emitting module according to claim 2, wherein the color conversion layer comprises a KSF phosphor.

12. The display device according to claim 7, wherein a thickness of the first substrate is between 5 μm to 10 μm.

13. The display device according to claim 7, wherein a distribution density of the electronic elements is greater than or equal to 1 element/6 mm2.

14. The display device according to claim 7, wherein the light emitting module further comprises a display panel, the display panel is located on a light emitting side of the electronic element, the display panel comprises a second substrate, and a thickness of the second substrate is about 0.15 mm.

15. The display device according to claim 7, wherein the light emitting module further comprises a color conversion layer, and the color conversion layer is located on a light emitting side of the electronic element.

16. The display device according to claim 7, wherein the color conversion layer comprises a KSF phosphor.

17. A method of manufacturing a light emitting module, comprising:
coating a layer of organic material on a rigid carrier plate, so as to form a first substrate;
forming, on the first substrate, an electronic element array and an encapsulation layer that covers the electronic element array, wherein the electronic element array comprises a plurality of electronic elements;
peeling the first substrate from the rigid carrier plate;
forming a bonding portion on a back frame; and
directly attaching a peeled first substrate to the back frame through the bonding portion,
wherein the bonding portion comprises a first surface facing the back frame and a second surface facing the first substrate, the first surface and the second surface are oppositely disposed, the back frame is in direct contact with the first surface of the bonding portion, and the first substrate is in direct contact with the second surface of the bonding portion.

18. The method according to claim 17, wherein a thickness of the first substrate is between 5 μm to 10 μm.

* * * * *